(12) United States Patent
Asao et al.

(10) Patent No.: US 6,184,600 B1
(45) Date of Patent: Feb. 6, 2001

(54) ALTERNATING-CURRENT GENERATOR FOR VEHICLES AND HEAT SINK INCORPORATED THEREIN

(75) Inventors: Yoshihito Asao; Shinji Nakashima; Katsumi Adachi, all of Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/486,395
(22) PCT Filed: Jul. 1, 1998
(86) PCT No.: PCT/JP98/02964
 § 371 Date: Feb. 28, 2000
 § 102(e) Date: Feb. 28, 2000
(87) PCT Pub. No.: WO00/02429
 PCT Pub. Date: Jan. 13, 2000
(51) Int. Cl.[7] ............................. H02K 11/00; H02K 5/18; F28F 7/00
(52) U.S. Cl. ............................. 310/64; 310/58; 310/68 D; 165/47; 165/80.3
(58) Field of Search .................................. 310/52, 58, 59, 310/60 R, 62–63, 60 A, 64, 68 D; 29/596–598; 165/47, 80.2, 80.3, 185

(56) References Cited

U.S. PATENT DOCUMENTS

| | | | |
|---|---|---|---|
| 4,840,222 | * 6/1989 | Lakin et al. | 165/47 |
| 5,258,673 | * 11/1993 | Gotoh | 310/68 D |
| 5,358,673 | 10/1994 | Heller et al. | 264/22 |
| 5,375,655 | * 12/1994 | Lee | 165/185 |
| 5,875,096 | * 2/1999 | Gates | 361/704 |
| 6,114,783 | * 9/2000 | Asao | 310/58 |

FOREIGN PATENT DOCUMENTS

| | | |
|---|---|---|
| 55-97169 | 7/1980 | (JP) . |
| 58-149078 | 10/1983 | (JP) . |
| 58-149079 | 10/1983 | (JP) . |
| 61-232699 | 10/1986 | (JP) . |
| 2-114368 | 9/1990 | (JP) . |
| 5-4784 | 1/1993 | (JP) . |
| 5-102683 | 4/1993 | (JP) . |
| 8-182279 | 7/1996 | (JP) . |

* cited by examiner

Primary Examiner—Tran Nguyen
(74) Attorney, Agent, or Firm—Sughrue, Mion, Zinn, Macpeak & Seas, PLLC

(57) ABSTRACT

Objects of the present invention are to provide a highly mass-producible heat sink ensuring excellent cooling performance, and to provide an automotive alternator capable of stable running by suppressing temperature increases in diodes of a rectifier and in a stator.

The heat sink is a die cast provided with a flat base 41 having a generally rectangular planar shape, one surface thereof constituting a surface for mounting heat-generating components, and a plurality of fins 42 disposed on the other surface of the base 41 at a pitch (P) in the longitudinal direction of the base, each rising perpendicularly from the other surface of the base and projecting in the longitudinal direction of the base, the projecting height (H) of the fins from the base being five or more times the thickness (T) of the fins. The plurality of fins 42 are formed such that the thickness (T), height (H), and pitch (P) of the fins satisfy the expressions $T \leq 1$ mm and $0.35 \leq T/P \leq 0.6$.

8 Claims, 14 Drawing Sheets

Air flow

Air flow

Air flow

ALTERNATING-CURRENT GENERATOR FOR VEHICLES AND HEAT SINK INCORPORATED THEREIN

TECHNICAL FIELD

The present invention relates to an automotive alternator mounted to an automotive engine and to a heat sink installed on a rectifier therein.

BACKGROUND ART

FIG. 12 is a cross-section showing an example of a conventional automotive alternator. The alternator in FIG. 12 includes: a case 3 consisting of an aluminum front bracket 1 and an aluminum rear bracket 2; a shaft 6 disposed in the case 3 so as to rotate freely by means of bearings to one end of which a pulley 4 is secured; a Lundell-type rotor 7 secured to the shaft 6 and housed in the case 3; fans 5 secured to both ends of the rotor 7; a stator 8 secured to the inner wall of the case 3 so as to surround the rotor 7; slip rings 9 secured to the other end of the shaft 6 for supplying electric current to the rotor 7; a pair of brushes 10 disposed in the case 3 so as to slide in contact with the slip rings 9; a brush holder 11 accommodating the brushes 10; a rectifier 12 electrically connected to the stator 8 for rectifying alternating current generated in the stator 8 into direct current; a heat sink 17 fitted over the brush holder 11; and a regulator 18 attached to the heat sink by adhesive for regulating the magnitude of the alternating current generated in the stator 8.

The regulator 18 is constructed by mounting onto a ceramic board power transistors for controlling the excitation current flowing to the rotor 7 and other control circuits. Then, the heat sink 17, which has a plurality of fins, is fixed to the reverse side of the ceramic board (the side on which the power transistors and control circuits are not mounted) using adhesive, so as to radiate heat generated by the power transistors.

As shown in FIGS. 13 and 14, the rectifier 12 includes a positive-side heat sink 24 to which a plurality of positive-side diodes 23 functioning as unidirectional conducting elements are joined, and a negative-side heat sink 26 to which a plurality of negative-side diodes 25 functioning as unidirectional conducting elements are joined, and a circuit board 27. The positive-side and negative-side heat sinks 24, 26 each has a plurality of straight fins 24a, 26a projecting perpendicular to the shaft 6 and extending parallel to the shaft 6. For example, twenty of these fins 24a, 26a may be provided having an average thickness of 1.3 mm in the direction of projection, a pitch of 2.5 mm, and a projecting height of 14 mm. The plurality of diodes 23, 25 are joined with predetermined spacing by soldering to the surfaces of the heat sinks 24, 26, respectively, parallel to the shaft 6 on the opposite side to the side on which the fins 24a, 26a are disposed. The heat sinks 24, 26 are assembled so that the backs of each of the diodes 23, 25 are positioned opposite each other in the radial direction. Leads 23a, 25a of the paired positive-side and negative-side diodes 23, 25 are gathered together in one place at the connecting terminals 27a of the circuit board 27, and are each connected to the output terminals 16a of the stator coil 16, so as to rectify three-phase alternating current into direct current. Furthermore, heat generated by the diodes 23, 25 due to power generation is radiated from the fins 24a, 26a disposed on the heat sinks 24, 26.

The rotor 7 includes: a rotor coil 13 for generating magnetic flux by passing electric current therethrough; and a pole core 14 disposed so as to cover the rotor coil 13 in which magnetic poles are formed by the magnetic flux generated by the rotor coil 13. The pole core 14 includes a first pole core body 21 and a second pole core body 22 which mutually interlock.

The stator 8 includes: a stator core 15; and a stator coil 16 composed of wire wound onto the stator core 15 in which an alternating current is generated by changes in the magnetic flux from the rotor coil 13 as the rotor 7 rotates.

In a conventional automotive alternator constructed in the above manner, current is supplied by a battery (not shown) through the brushes 10 and slip rings 9 to the rotor coil 13, whereby magnetic flux is generated, and at the same time, the rotational torque of the engine is transferred to the shaft by means of the pulley 4, rotating the rotor 7 so that a rotating magnetic field is imparted to the stator coil 16 and electromotive force is generated in the stator coil 16. This alternating electromotive force passes through the rectifier 12 and is rectified into direct current, the magnitude thereof is regurated by the regulator 18, and the battery is recharged.

Now, the rotor coil 12, the stator coil 16, the rectifier 12, and the regulator 18 constantly generate heat during power generation. In an alternator with a rated output current in the 100 A class, the amount of heat generated in the rotor coil 12, the stator coil 16, the rectifier 12, the regulator 18 is 60 W, 500 W, 120 W, and 6 W, respectively.

Intake openings 1a, 2a and exhaust openings 1b, 2b for allowing ventilation generated by the fans 5 disposed on the rotor 7 to pass through are bored in the front bracket 1 and the rear bracket 2. Thus, in the rear end, due to the rotation of the fans 5 (rotor 7), air from outside flows into the case 3 through the intake openings 2a disposed opposite the heat sinks 17, 24, 26, flows through the heat sinks 17, 24, 26 and cools the rectifier 12 and the regulator 18. Then that air is redirected centrifugally by the fans 5, cools the stator coil ends in the rear end and is then discharged to the outside through the exhaust openings 2b. In the front end, due to the rotation of the fans 5, air from outside flows axially into the case 3 through the intake openings 1a, then that air is redirected centrifugally by the fans 5, cools the stator coil ends in the front end, and is then discharged to the outside through the exhaust openings 1b.

The fins disposed on the heat sinks 17, 24, 26 are formed perpendicular to the contact surfaces between the ceramic board and diodes and the heat sinks 17, 24, 26, and temperature increases in the diodes 23, 25 of the rectifier 12 and the power transistors of the regulator 18 are suppressed by heat exchange with the air flowing between the fins. When the amount of heat generated and the materials used are constant, the value of the temperature increase dt is greatly dependent on the speed v of the air flowing through the heat sinks and the surface area A of the fins, and the relationship between them can be expressed by Expression (1):

$$dt \propto Q/(A \times v^{\alpha}) \quad (1)$$

Moreover, α is determined by the state of the air flowing through the heat sinks, and is 0.5 if the flow is laminar and 0.8 if the flow is turbulent.

From Expression 1, it can be seen that temperature increases dT can be suppressed by increasing the surface area A of the fins, and in a limited space, this means making the fins thinner and increasing the number of fins. However, although the surface area of the fins can be increased by making the fins thinner and increasing the number of fins, the amount of ventilation passing through decreases, reducing the speed v of the air, and consequently temperature increases cannot be suppressed in this way.

FIG. 15 is a cross-section showing another example of a conventional automotive alternator such as that described in Japanese Patent Laid-Open No. HEI 8-182279, FIG. 16 is a planar projection of the rear bracket of the automotive alternator shown in FIG. 15, and FIGS. 17 and 18 are a perspective and a plan, respectively, showing a rectifier used in the automotive alternator shown in FIG. 15.

Apart from the use of a rectifier 30, the construction of this conventional automotive alternator is the same as for the conventional automotive alternator shown in FIG. 12.

The rectifier 30 used in this conventional automotive alternator includes a positive-side heat sink 31 to which a plurality of positive-side diodes 23 are joined, and a negative-side heat sink 32 to which a plurality of negative-side diodes 25 are joined, and a circuit board 33. The heat sinks 31, 32 and the circuit board 33 are each formed in a horseshoe shape. A plurality of fins 31a are disposed radially on one surface of the positive-side heat sink 31. The plurality of diodes 23 are joined with predetermined spacing by soldering to the surface of the heat sink 31 on the opposite side to the side on which the fins 31a are disposed. On the other hand, no fins are disposed on the negative-side heat sink 32 and the plurality of diodes 25 are joined with predetermined spacing by soldering to the main surface thereof. The heat sinks 31, 32 are coaxially assembled so that the surfaces mounted with the diodes 23, 25 lie on the same plane, and the leads 23a, 25a of each of the paired diodes 23, 25 are positioned so as to be opposite each other in the radial direction. Then, the leads 23a, 25a of the paired diodes 23, 25 are gathered together in one place at the connecting terminals 33a of the circuit board 33, and are each connected to the output terminals 16a of the stator coil 16.

In a rectifier 30 constructed in this manner, the surfaces of the heat sinks 31, 32 mounted with the diodes 23, 25 are perpendicular to the axis of the shaft 6, and are mounted to the rear bracket 2 so as to be coaxial to the shaft 6. Here, the negative-side heat sink 32 is directly mounted to a bearing surface in the rear bracket 2, and is grounded. Furthermore, the fins 31a project parallel to the axis of the shaft 6 at a right angle from one surface of the heat sink 31, and form a radial pattern extending towards the axis of the shaft 6.

In this conventional automotive alternator, because the surface of the heat sink 31 mounted with the diodes is perpendicular to the axis of the shaft 6, air introduced through the intake openings 2a opposite the fins 31a by the rotation of the fans 5, flows between the fins 31a, then passes between the heat sink 31 and the shaft 6 and enters the fans 5. Because this heat sink 31 is formed in a horseshoe shape, the spaces between the fins 31a are narrower on the side closest the shaft 6. Thus, if the fins 31a are made thinner and the number thereof is increased, the flow of air is choked on the side closest to the shaft 6, leading to loss of cooling performance.

These heat sinks 24, 26, 31, 32 are usually prepared by a die cast manufacturing process, and if the fins are made too thin, misruns and die removal problems occur, making it impossible to prepare the heat sinks. Conversely, if the thickness of the mold corresponding to the spacing between the fins is too thin relative to the thickness of the fins, the working life of the mold is significantly reduced compared to a normal die with which it is possible to mold 200,000 shots.

SUMMARY OF THE INVENTION

An object of the present invention is to provide a highly mass-producible heat sink ensuring excellent cooling performance.

Another object of the present invention is to provide an automotive alternator capable of stable running by suppressing temperature increases in the diodes of the rectifier and in the stator.

A heat sink according to the present invention is a die cast heat sink provided with:

a flat base having a generally rectangular planar shape, one surface thereof constituting a surface for mounting heat-generating components; and a plurality of fins disposed on the other surface of the base at a pitch (P) in the longitudinal direction of the base, each rising perpendicularly from the other surface of the base and projecting in the longitudinal direction of the base, wherein the projecting height (H) of the fins from the base is five or more times the thickness (T) of the fins, and wherein the plurality of fins are formed such that the thickness (M), height (H), and pitch (P) of the fins satisfy the expressions $T \leq 1$ mm and $0.35 \leq T/P \leq 0.6$.

Furthermore, a heat sink according to the present invention is a die cast heat sink provided with:

a flat base having a planar horseshoe shape, one surface thereof constituting a surface for mounting heat-generating components; and a plurality of fins disposed on the other surface of the base in a radial pattern at even angular pitch in the circumferential direction of the base, each rising perpendicularly from the other surface of the base, wherein the projecting height (H) of the fins from the base is five or more times the thickness (T) of the fins, and wherein the plurality of fins are formed such that the thickness (T), height (H), and pitch (P) of the fins at the inner circumferential end satisfy the expressions $T \leq 1$ mm and $0.35 \leq T/P \leq 0.6$.

Furthermore, an automotive alternator according to the present invention includes:

a rotor housed inside a case and supported so as to rotate freely by means of a rotor shaft;

a stator disposed inside the case so as to surround the outer circumference of the rotor; and a rectifier provided with a positive-side and a negative-side heat sinks supporting positive-side and negative-side unidirectional conducting elements, respectively, for rectifying alternating current generated by the rotor, wherein the both heat sinks are composed of flat bases having planar horseshoe shapes with different inside diameters from each other, and are disposed such that the planes of each of horseshoe shapes lie generally on a same plane perpendicular to the axis of the shaft and the both bases overlap radially, wherein the positive-side and negative-side unidirectional conducting elements are supported on one surface of their respective bases, and wherein the heat sink disposed radially inside is a die cast provided with:

a plurality of fins disposed on the other surface of the base in a radial pattern at even angular pitch in the circumferential direction of the base, each rising perpendicularly from the other surface of the base, the projecting height (H) of the fins from the base being five or more times the thickness (T) of the fins, and the plurality of fins being formed such that the thickness (T), height (H), and pitch (P) of the fins at the inner circumferential end satisfy the expressions T≦1 mm and 0.35≦T/P≦0.6.

DETAILED DESCRIPTION OF THE PREFERRED EMBODIMENTS

The preferred embodiments of the present invention will now be explained with reference to the diagrams.

Embodiment 1

Figure 1:
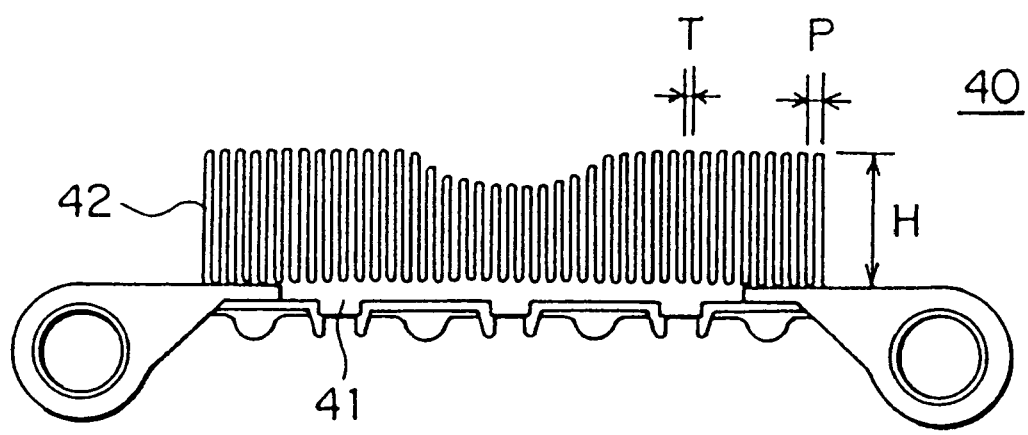
FIG. 1 is a plan showing a heat sink according to Embodiment 1 of the present invention.
Figure 2:
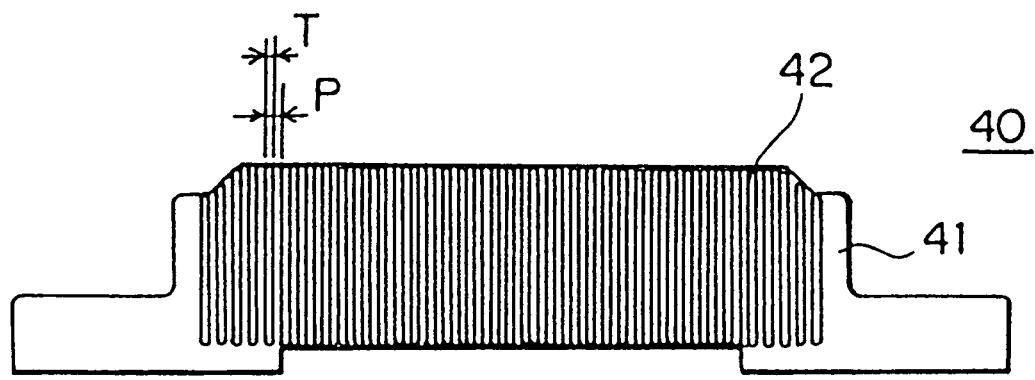
FIG. 2 is a front elevation showing a heat sink according to Embodiment 1 of the present invention.

FIGS. 1 and 2 are a plan and a front elevation, respectively, showing a heat sink for a rectifier used in an automotive alternator according to Embodiment 1 of the present invention.

The heat sink 40 in FIGS. 1 and 2 is die cast from ADC10 material and includes:

a flat base 41 having a generally rectangular planar shape, one surface thereof constituting a surface for mounting diodes which are heat-generating components; and a plurality of fins 42 with a predetermined thickness (T) projecting from the other surface of the base 41 to a predetermined height (H) so as to be perpendicular to the longitudinal direction of the base 41, and disposed at a predetermined pitch (P) to the longitudinal direction of the base 41.

To assemble a rectifier using the heat sinks 40, first, a heat sink 40 constructed by joining a plurality of positive-side diodes to one surface of a base 41 in the longitudinal direction of the base 41 and a heat sink 40 constructed by joining a plurality of negative-side diodes to one surface of a base 41 in the longitudinal direction of the base 41 are prepared. Then, the two heat sinks 40 are placed together so that the backs of the positive-side diodes and the backs of the negative-side diodes are opposite each other in the radial direction, a circuit board is placed over the two heat sinks 40, and the leads of the paired positive-side and negative-side diodes are gathered together in one place at the connecting terminals of the circuit board, completing assembly of the rectifier. Moreover, conventional diodes and circuit boards may be used.

A rectifier assembled in this manner is mounted to an automotive alternator in place of the conventional rectifier 12.

Figure 3:
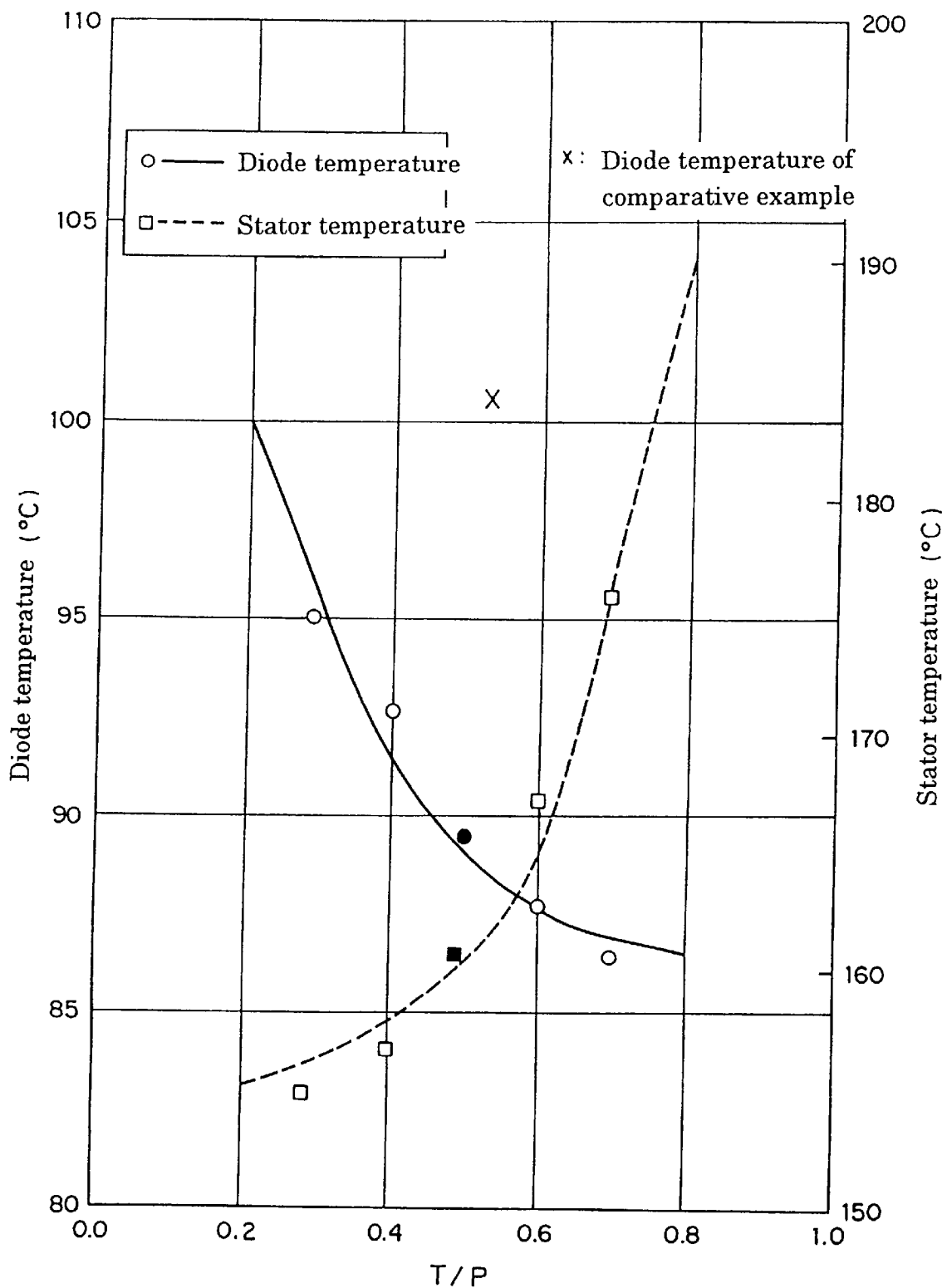
FIG. 3 is a graph showing the temperature increase in a stator and in the diodes of a rectifier in an automotive alternator incorporating a heat sink according to Embodiment 1 of the present invention.

FIG. 3 shows the results of measurements of temperature increases in the diodes and in the rear end of the stator coil when a rectifier was prepared using heat sinks 40 each formed with 39 fins 42 having a thickness (T) of 0.8 mm and a height (H) of 14 mm at a pitch (P) of 1.6 mm, and the rectifier was installed in an automotive alternator having a stator core 15 with a diameter (ø) of 128 mm and a rated output of 12V/100A. Moreover, for comparison, the temperature increases in the diodes of a conventional rectifier 12 using heat sinks 23, 25 formed with 20 fins 24a, 26a having an average thickness (T) of 1.3 mm and a height (H) of 14 mm at a pitch (P) of 2.5 mm was measured in the same manner.

From FIG. 3, it was found that whereas the temperature of the diodes was 87° C. and the stator temperature was 165° C. in an automotive alternator using a rectifier according to Embodiment 1, the temperature of the diodes was 101° C. in an automotive alternator using a conventional rectifier, and temperature reducing effects were obtained using the heat sinks 40.

Next, rectifiers were prepared using heat sinks 40 having a fin thickness (T) of 0.8 mm and various ratios (T/P) of fin thickness (T) to pitch (P), and the results of measurements of temperature increases in the diodes and in the rear end of the stator coil when these rectifiers were installed in automotive alternators are shown in FIG. 3.

From FIG. 3, it can be seen that as T/P increases the value of the temperature increase in the diodes is reduced, but the temperature of the stator tends to increase. This is thought to be because as T/P increases, fin spacing narrows, increasing pressure loss and reducing the amount of ventilation intake in the heat sink portion. In the case of the diodes, however, although the speed of the air between the fins contributing to cooling is decreased by the reduction in the amount of ventilation intake, it appears to be more important that the number of fins which can be formed is increased by reducing the pitch, thereby increasing the fin surface area A contributing to cooling. As can be seen from FIG. 3, considering the temperatures of both the diodes and the stator, it is desirable that T/P be 0.3 or more and 0.7 or less.

In order to improve the cooling effect, it is necessary to make the fins thinner and increase their number. Normally, heat sinks are prepared by a die cast manufacturing process, and for tall fins in which the fin height is five or more times the thickness of the fins, when the thickness of the fins is reduced to 1 mm or less, misruns and die removal problems occur, and if the fins are made thinner than 0.4 mm, for example, heat sink preparation becomes impossible. When the thickness of the fins is 0.8 mm and the height is 14 mm, as in Embodiment 1, if T/P exceeds 0.6, the thickness of the mold between the fins is reduced to approximately 0.5 mm compared to a height of 14 mm. As a result, the mold is weakened, and at about 50,000 shots, surface cracks form in this portion of the mold, giving rise to poor molding, and wear occurs from the edge portions of the mold, making it impossible to use the mold any further.

The above trends will now be discussed qualitatively.

The factors determining temperature increase are $A \times v^{\alpha}$ from expression (1) above, so let these be cooling K. Moreover, because Q in expression (1) is given to be rectifying a uniform output current, it can be assumed to be constant. Thus, $$K = A \times v^{\alpha}.$$

Now, because the space occupied by the fins is constant, that is to say, the area of the surface on which the fins are formed on the base of the heat sink is constant, the fin surface area A is expressed by $$A \text{ (number of fins)} \times \text{(efficiency of fins)} (W/P) \times \xi$$

where W is the length of the surface on which the fins are formed on the base in the longitudinal direction, and $\xi$ is the efficiency of the fins.

Similarly, ventilation passage cross-section A' is expressed by $$A' \text{ (number of fins)} \times \text{(fin pitch–fin thickness)/(fin pitch)} (P-T) \times P.$$

Figure 4:
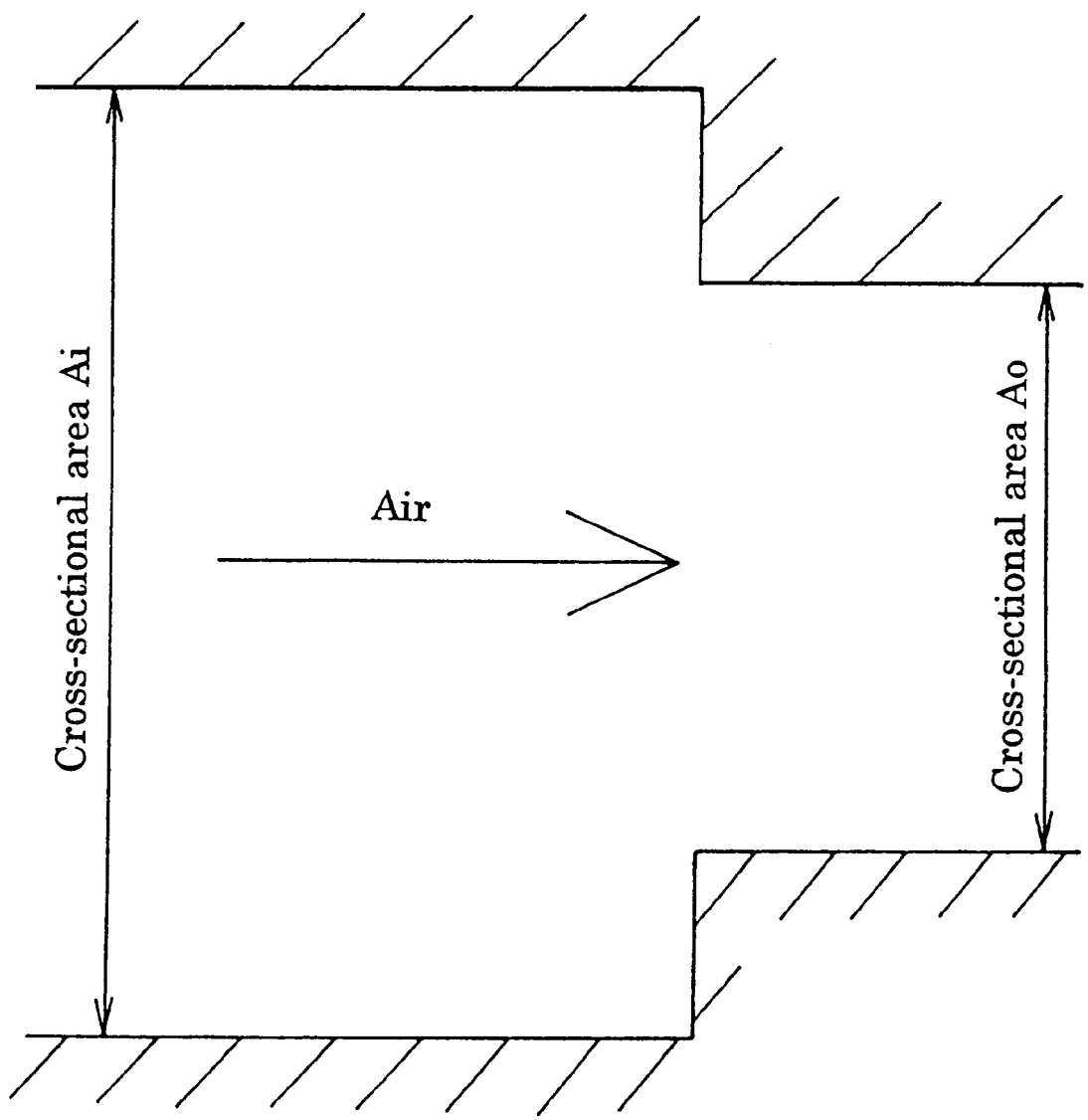
FIG. 4 is a diagram showing a resistance system in a contraction model.

Furthermore, in the case of general contraction, the coefficient of resistance $\partial$ is expressed by $$\partial = k \times \{1 - (A_o/A_i)^2\}$$

where Ai is the passage cross-sectional area prior to contraction, and Ao is the passage cross-sectional area after contraction as shown in FIG. 4. Moreover, k is a constant. Substituting in the terms for the present heat sink, this becomes $$\partial = k \times [1 - \{A'/W \times H)\}^2] 1 - \{A'/(W \times H)\}^2.$$

Since the relationship between pressure loss ΔP and speed v is $$\Delta P = \partial \times (\text{air density})/2 \times v^2 \partial \times v^2$$

the speed v is given by $$v = (\Delta P/\partial)^{1/2}.$$

Now, if the cooling fans are uniform and pressure loss variations are assumed to be minimal and able to be ignored, then $$v \partial^{-1/2}.$$

Thus, cooling K can be expressed by $$K = A \times v^{\alpha} (W/P) \times \xi \times (\partial^{-1/2})^{\alpha}.$$

Figure 5:
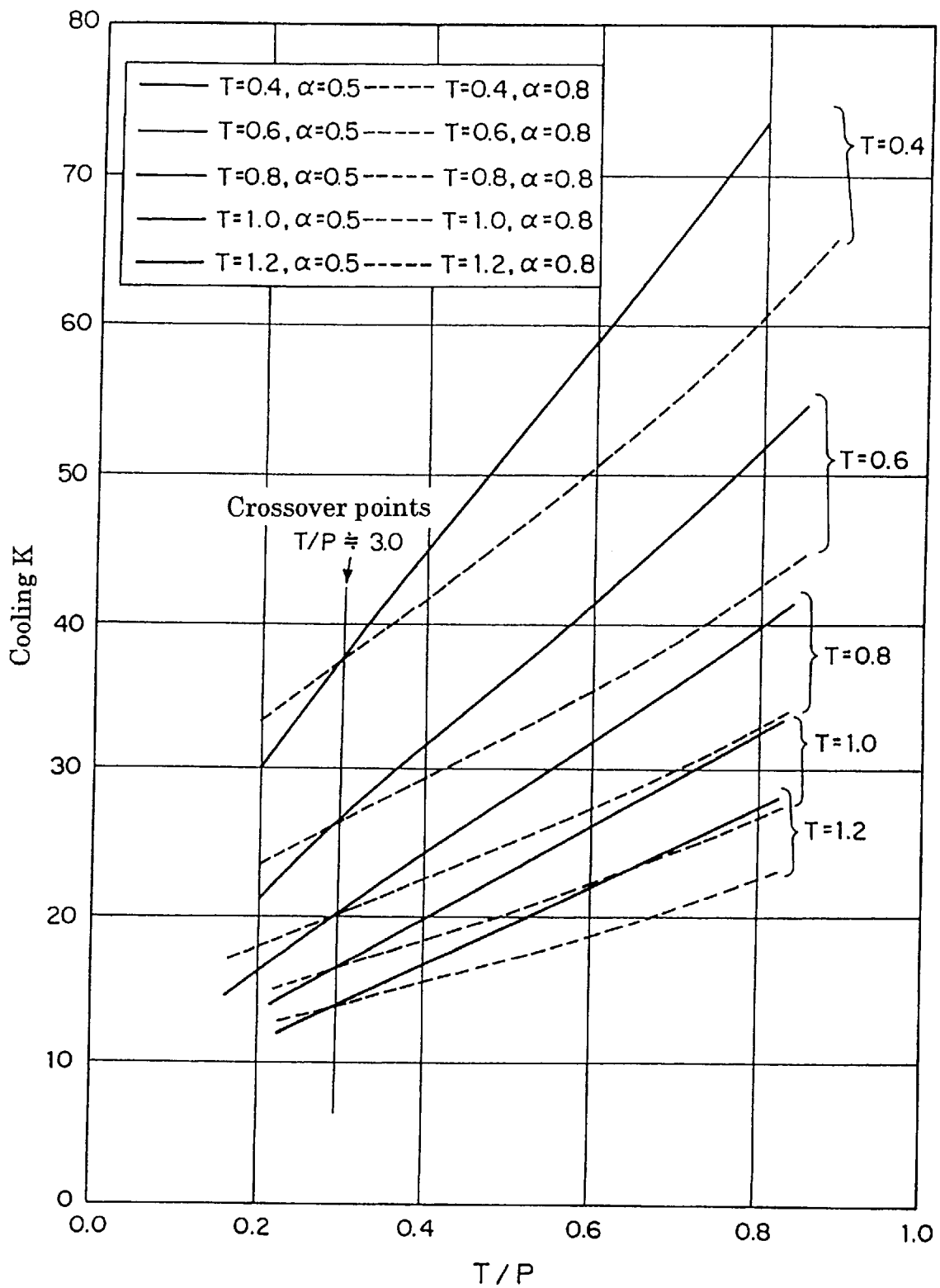
FIG. 5 is a graph showing the relationship between T/P and cooling in a heat sink according to Embodiment 1 of the present invention.

Now, FIG. 5 shows the relationship between T/P and cooling K in a heat sink in which W=60 mm and H=15 mm in cases where the fin thickness is 0.4 mm, 0.6 mm, 0.8 mm, 1.0 mm, and 1.2 mm.

It can be seen from FIG. 5 that when the fin thickness is constant, cooling K improves as T/P increases, showing the same trend as the above experimental results. This is due to the fact that when T/P is increased, the number of fins which can be formed is increased, increasing the fin surface area A contributing to cooling. Furthermore, the thinner the fin thickness, the better the cooling K. Thus, from the point of view of cooling K, it is desirable that the fin thickness is 1 mm or less.

Furthermore, it can be seen from FIG. 5 that there are crossover points in the vicinity of T/P=0.3 between the curves for cooling K in the case where the air flow is laminar and the curves for cooling K in the case where the air flow is turbulent. Cooling performance varies with the state of the air flow. This is because the heat transfer coefficient between the heat transfer surface and the air depends on the speed of the air to the power of 0.5 when the flow is laminar, and to the power of 0.8 when the flow is turbulent. The state of the flow is determined by the Reynolds number of the main flow, but microscopically there are intermediate regions between turbulence and laminar flow due to collisions with obstructions, curvature of the flow, etc. According to these results, when α changes from 0.5 to 0.8, there is a crossover point in the vicinity of where T/P is 0.3, and inversion of cooling due to changes in the state of the flow only occurs in the vicinity of where T/P is 0.3.

Consequently, since the state of the air flow varies depending on the size of the alternator and the rotational frequency, when designing heat sinks, it is possible to obtain a heat sink with stable cooling performance which is not affected by the state of the flow by designing T/P outside the vicinity of 0.3.

According to Embodiment 1, because the shape of the fins in a heat sink having tall fins in which H/T≧5 satisfies the expressions T≦1 mm and 0.35≦T/P≦0.6 in this manner, the temperature of the diodes can be suppressed without adversely affecting the stator temperature, and a highly mass-producible heat sink can be provided. Furthermore, the fin shape relationship serves as a design index for obtaining a heat sink with stable cooling performance not affected by the state of the air flow.

Moreover, in Embodiment 1, the thickness of the fins is assumed to be constant along the length of the fins, but when prepared by a die cast manufacturing process, it is actually necessary to have a removal taper of about 1 degree. However, because the fin surface area and air passage cross-sectional area remain practically unchanged even if the fin thickness T is applied as an average thickness between the tips and the root of the fins, there is no change in the effects of the above design index.

Furthermore, Embodiment 1 was explained for heat sinks used in rectifiers of automotive alternators, but the present heat sink is not limited to use in rectifiers for automotive alternators, and the same effects will be obtained even if it is applied to any other use involving forced air cooling.

Embodiment 2

Figure 6:
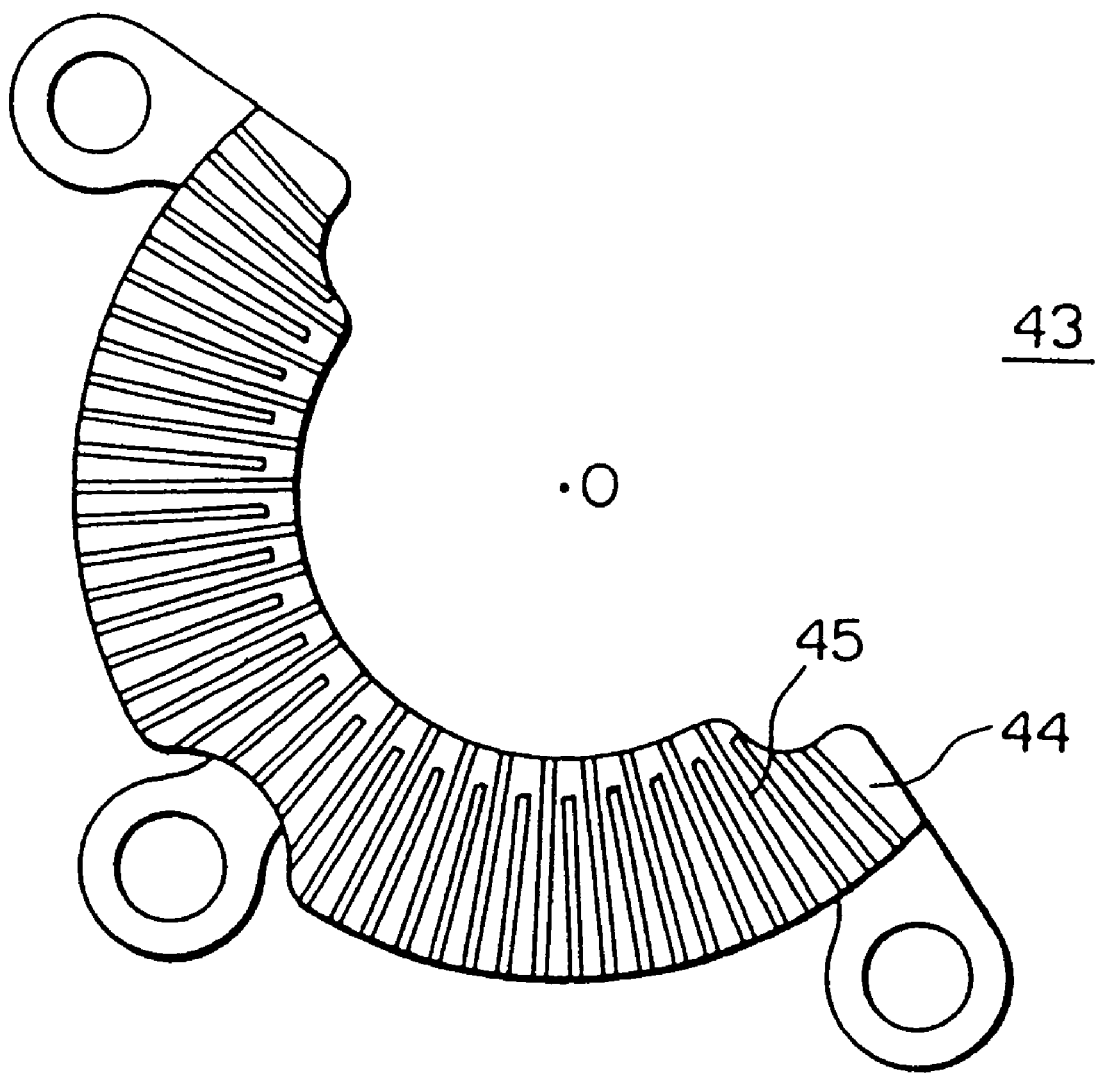
FIG. 6 is a plan showing a heat sink according to Embodiment 2 of the present invention.

FIG. 6 is a plan showing a heat sink according to Embodiment 2.

In FIG. 6, a heat sink 43 is prepared by die casting from ADC10 material and includes: a flat base 44 having a planar horseshoe shape; and a plurality of fins 45 disposed in a radial pattern centered on a point O such that each rises perpendicularly from one surface of the base 44. At the inner circumferential end of the plurality of fins 45, the radial length of every second fin is formed 2 mm shorter, ensuring spacing of 0.8 mm between adjacent fins.

Figure 7:
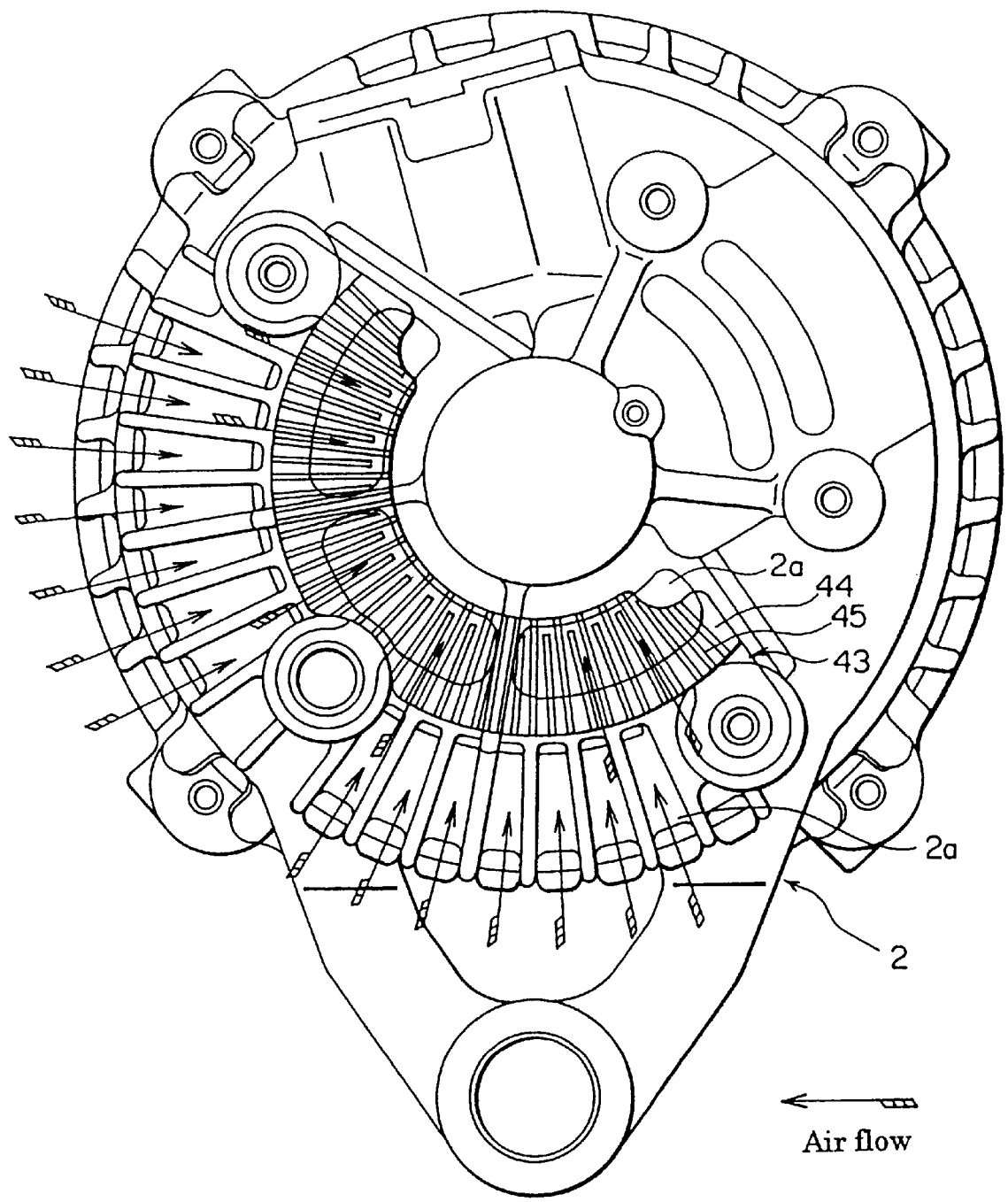
FIG. 7 is a planar projection of the rear bracket of an automotive alternator incorporating a heat sink according to Embodiment 2 of the present invention.

This heat sink 43 is used as a positive-side heat sink. The rectifier using this heat sink 43 is mounted to the rear bracket 2 such that the main surface of the base 44 is perpendicular to the central axis of the shaft 6 and the center (point 0) of the radial pattern of the fins 45 generally aligns with the central axis of the shaft 6, as shown in FIG. 7. Due to the rotation of the fans 5, air flows into the case 3 through the intake openings 2a disposed in portions opposite the fins 45 and through the intake openings 2a disposed in portions radially outside the fins 45, flows between the fins 45, then passes between the heat sink 43 and the shaft 6 and flows into the fans 5.

When the temperature increases of the diodes in the rectifier and in the stator were measured in an automotive alternator incorporating a heat sink 43 according to Embodiment 2, the temperature increase in the diodes was suppressed to 88° C., and the temperature increase in the stator was suppressed to 165° C.

Figure 8:
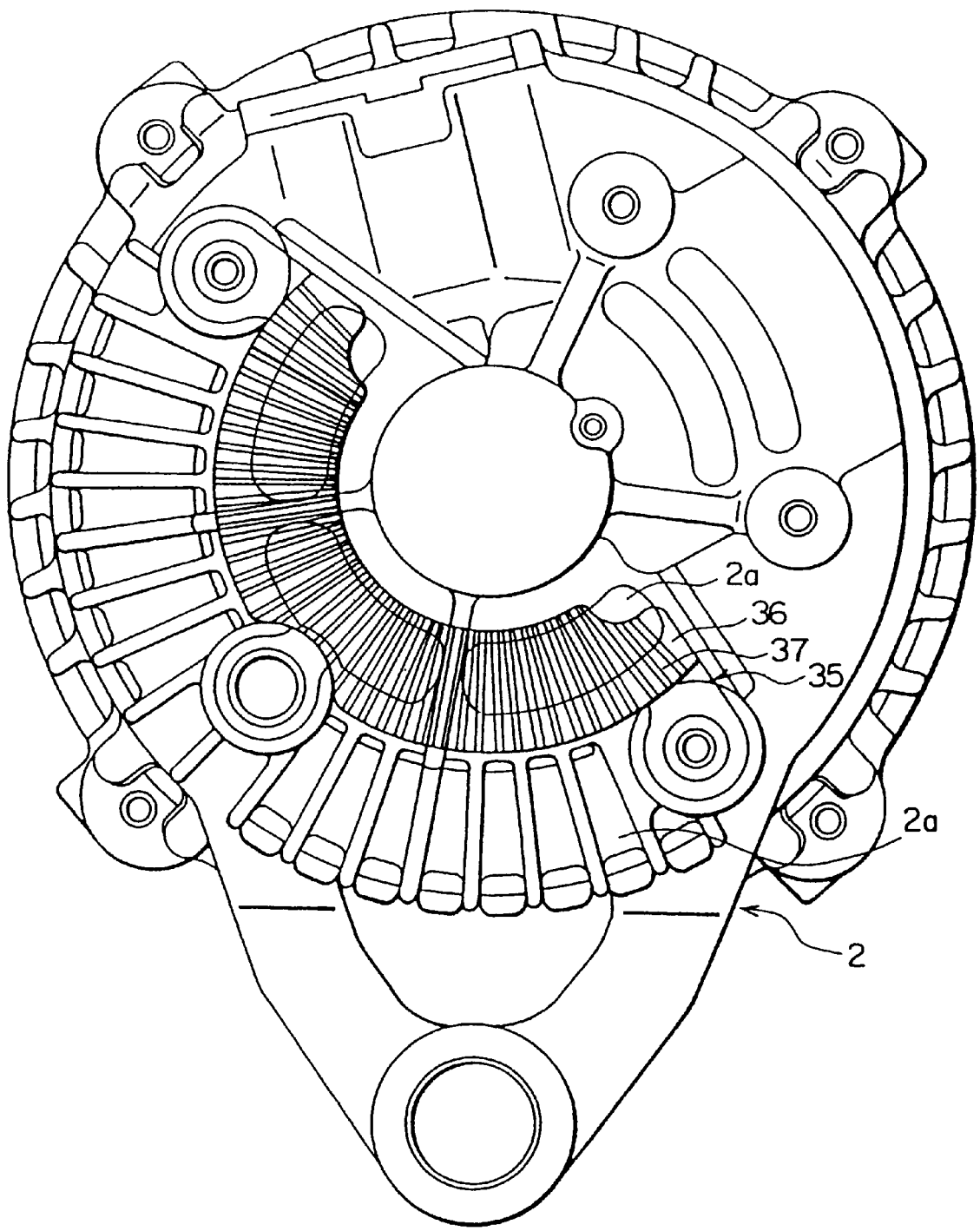
FIG. 8 is a planar projection of the rear bracket of an automotive alternator incorporating a heat sink of a comparative example.

Now, for comparison, a heat sink 35 was prepared having a plurality of fins 37 disposed in a radial pattern on one surface of a base 36, as shown in FIG. 8, and when the temperature increases of the diodes in the rectifier and in the stator were measured in an automotive alternator incorporating a rectifier using this heat sink 35, the temperature in the diodes rose to 99° C., and the temperature of the stator rose to 180° C. Moreover, the heat sink 35 of the comparative example was formed in the same shape as the heat sink 43 except for the shape of the inner circumferential ends of the fins, making the fin spacing at the inner circumferential end 0.5 mm.

In this manner, the heat sink 43 according to Embodiment 2 achieved results showing improved cooling performance over the heat sink 35 of the comparative example.

This is a result of the fact that because the fin spacing at the inner circumferential end is widened to 0.8 mm in Embodiment 2, the flow of air passing between the fins is not choked at the inner circumferential end, enabling suppression of reductions in the amount of ventilation intake. In other words, in the comparative example, because the fin spacing at the inner circumferential end was a narrow 0.5 mm, the flow of air passing between the fins 37 was choked at the inner circumferential end, reducing the amount of ventilation intake and causing loss of cooling performance.

Furthermore, because the radial length of every second fin is formed shorter at the inner circumferential end of the plurality of fins 45 in Embodiment 2, the spacing between adjacent fins at the inner circumferential end can be widened compared to the comparative example. In other words, when the fin spacing between adjacent fins at the inner circumferential end is made the same in both Embodiment 2 and the comparative example, the number of fins can be increased in Embodiment 2 compared to the comparative example, enabling cooling performance to be improved.

Embodiment 3

Figure 9:
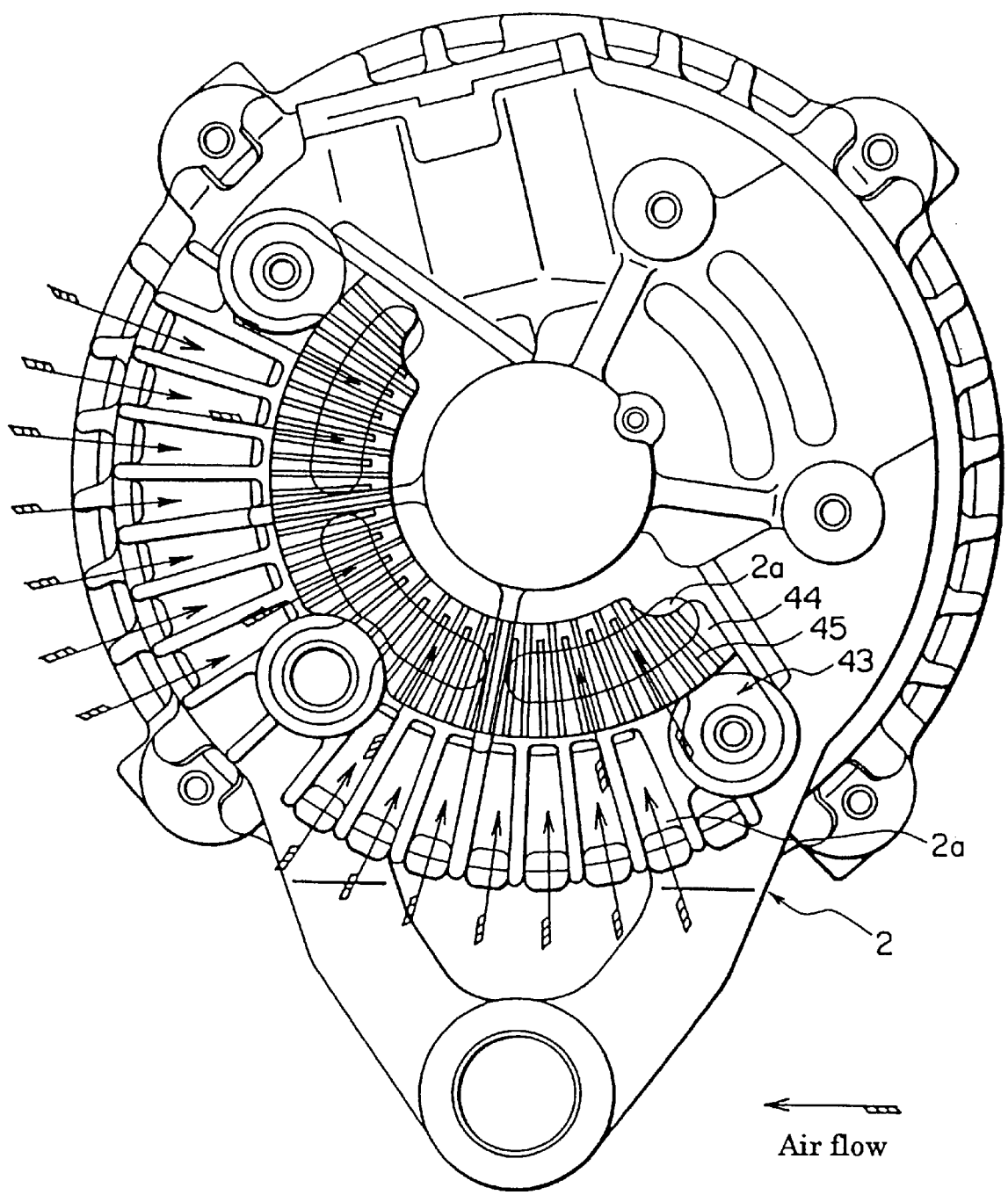
FIG. 9 is a planar projection of the rear bracket of an automotive alternator incorporating a heat sink according to Embodiment 3 of the present invention.

In Embodiment 2, the intake openings 2a in a portion of the rear bracket 2 opposite the fins are disposed such that their inner circumferential edge portions generally align with the inner circumferential end of the fins 45, but in Embodiment 3, as shown in FIG. 9, the inner circumferential edge portions of the intake openings 2a are disposed in the rear bracket 2 so as to be located in positions offset by 2 mm radially outwards from the inner circumferential ends of the fins 45 whose radial length has been shortened.

In this automotive alternator, when the temperature increases of the diodes in the rectifier and in the stator were measured, the temperature increase in the diodes was suppressed to 79° C., and the temperature increase in the stator was suppressed to 165° C.

This is because by offsetting the inner circumferential edge portions of the intake openings 2a by 2 mm radially outwards from the inner circumferential ends of the fins 45 whose radial length has been shortened, air which was flowing directly through the intake openings 2a into the inner circumferential ends of the fins 45 is thereby made to flow in from radially outside the fins 45 and contribute to cooling, further suppressing temperature increases in the diodes.

Embodiment 4

Figure 10:
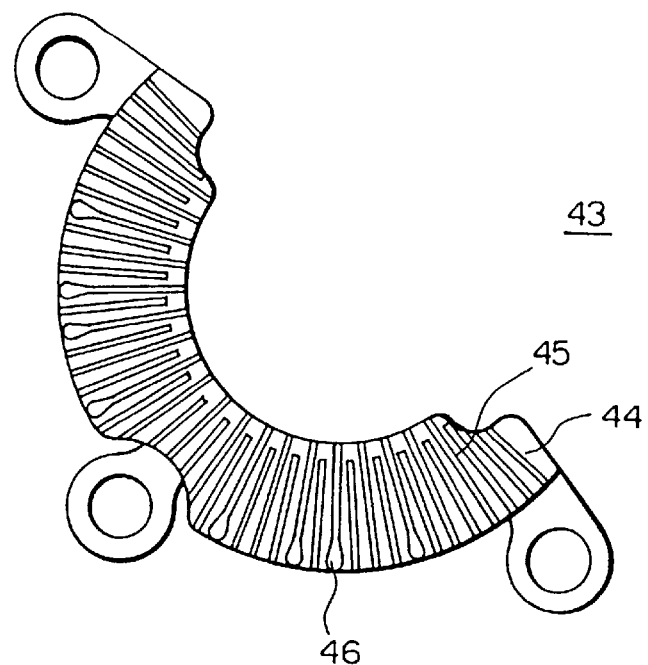
FIG. 10 is a plan showing a heat sink according to Embodiment 4 of the present invention.

FIG. 10 is a plan showing a heat sink according to Embodiment 4 of the present invention.

In FIG. 10, a thick portion 46 is formed at the outer circumferential end of a plurality of fins 45 of a heat sink 43. In addition, the spacing between the thick portion 46 and adjacent fins 45 is equal to or greater than the fin spacing at the inner circumferential end. Moreover, the rest of the construction is the same as for Embodiment 2.

Figure 11:
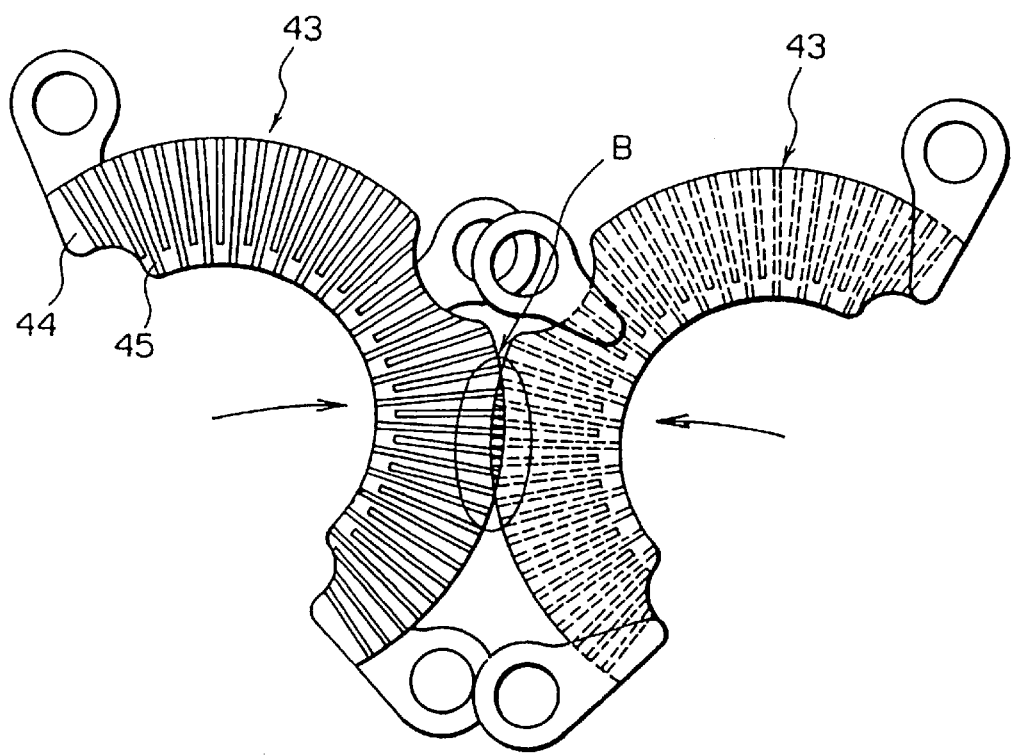
FIG. 11 is a diagram explaining the effects of a heat sink according to Embodiment 4 of the present invention.
Figure 12:
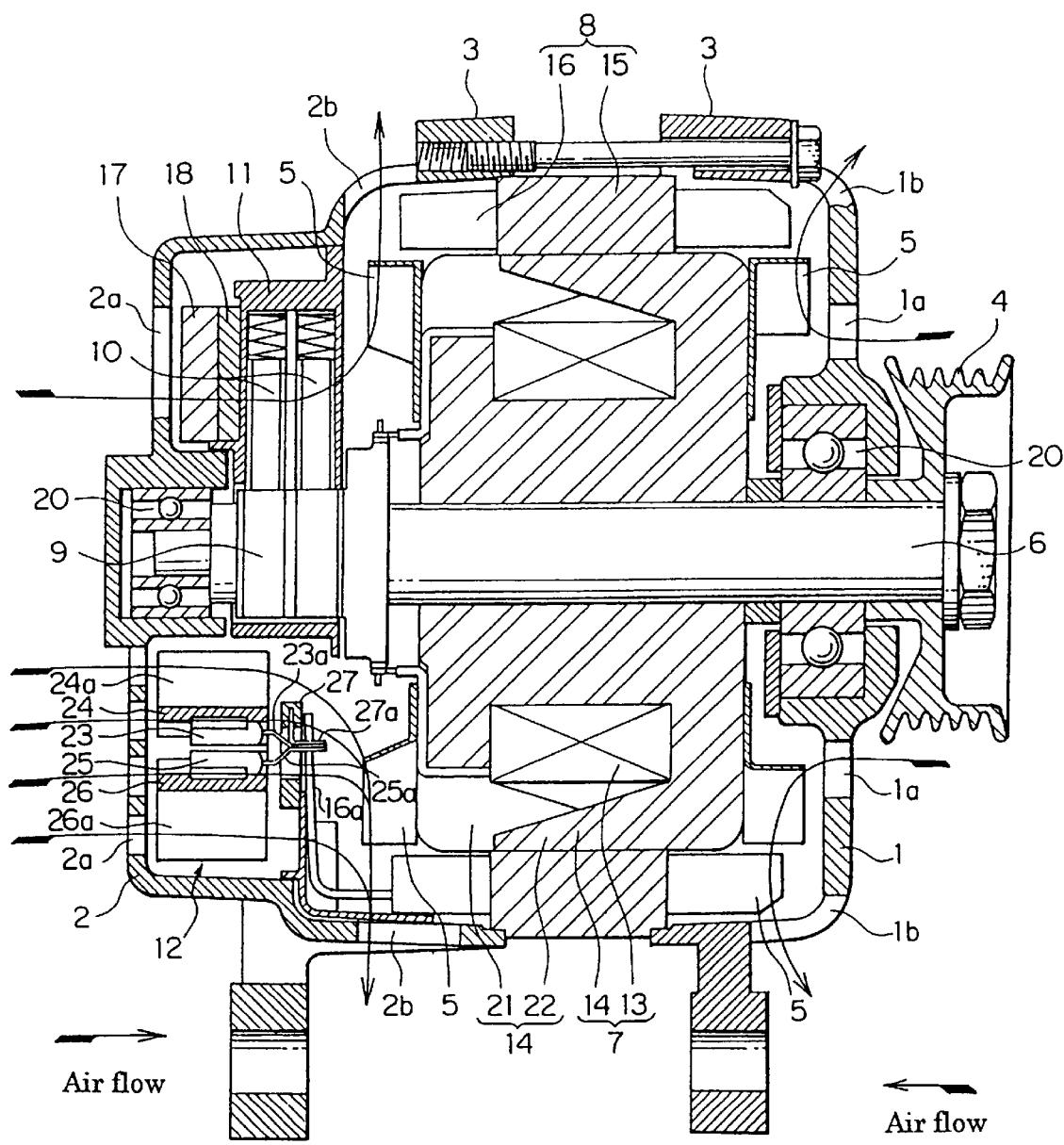
FIG. 12 is a cross-section showing a conventional automotive alternator.
Figure 13:
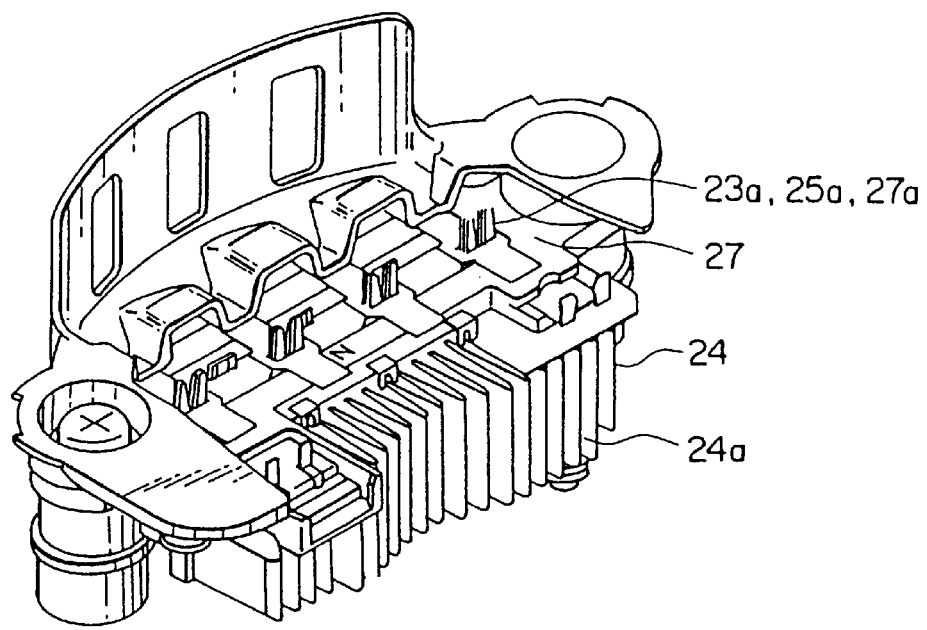
FIG. 13 is a perspective showing a conventional rectifier.
Figure 14:
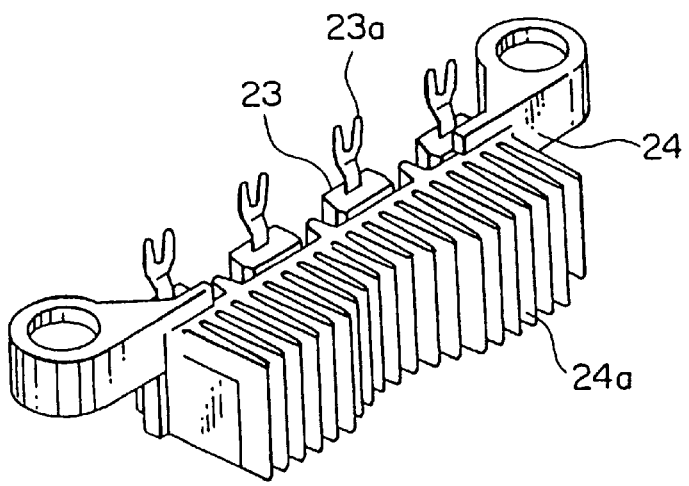
FIG. 14 is a perspective showing a conventional heat sink assembly.
Figure 15:
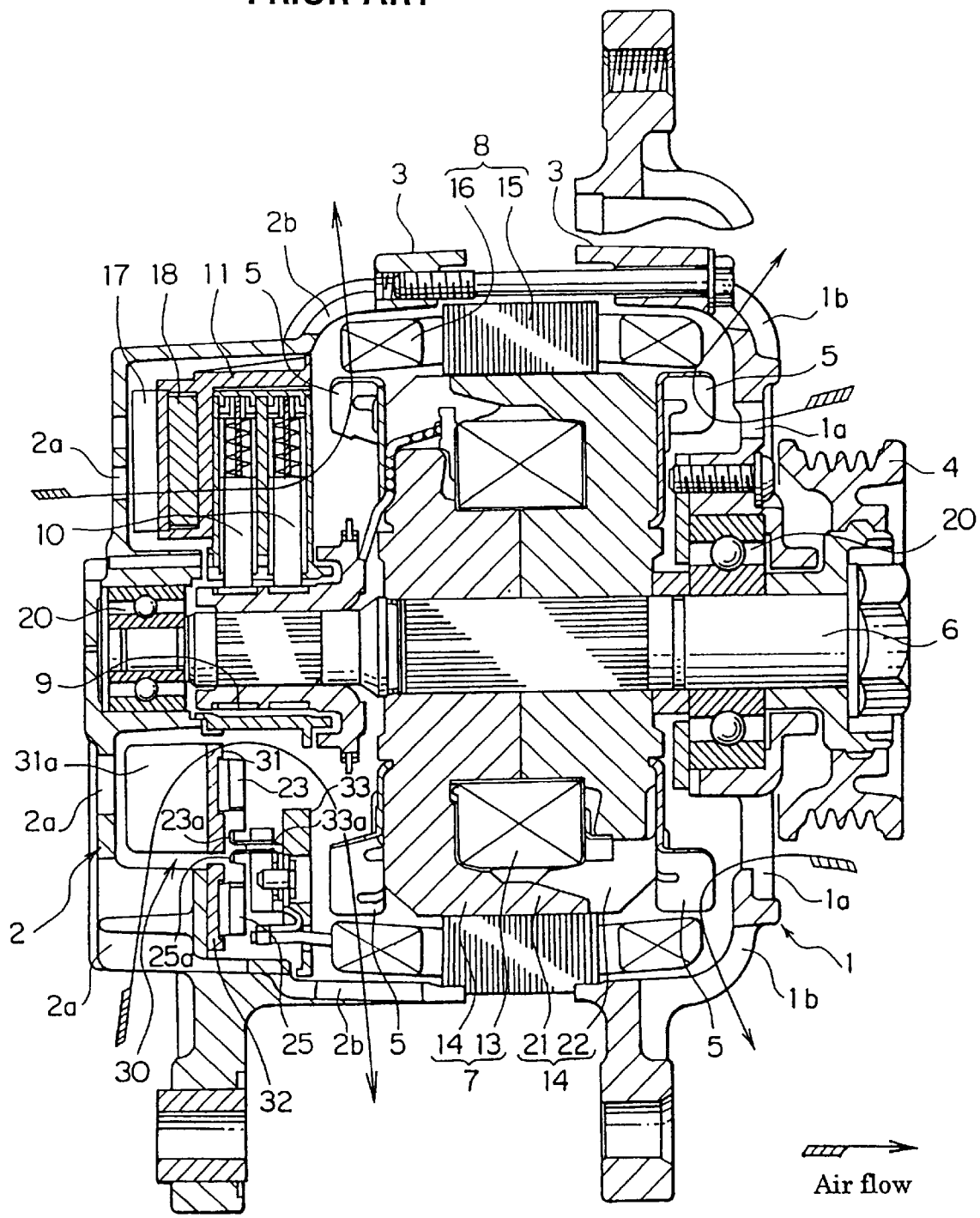
FIG. 15 is a cross-section showing another conventional automotive alternator.
Figure 16:
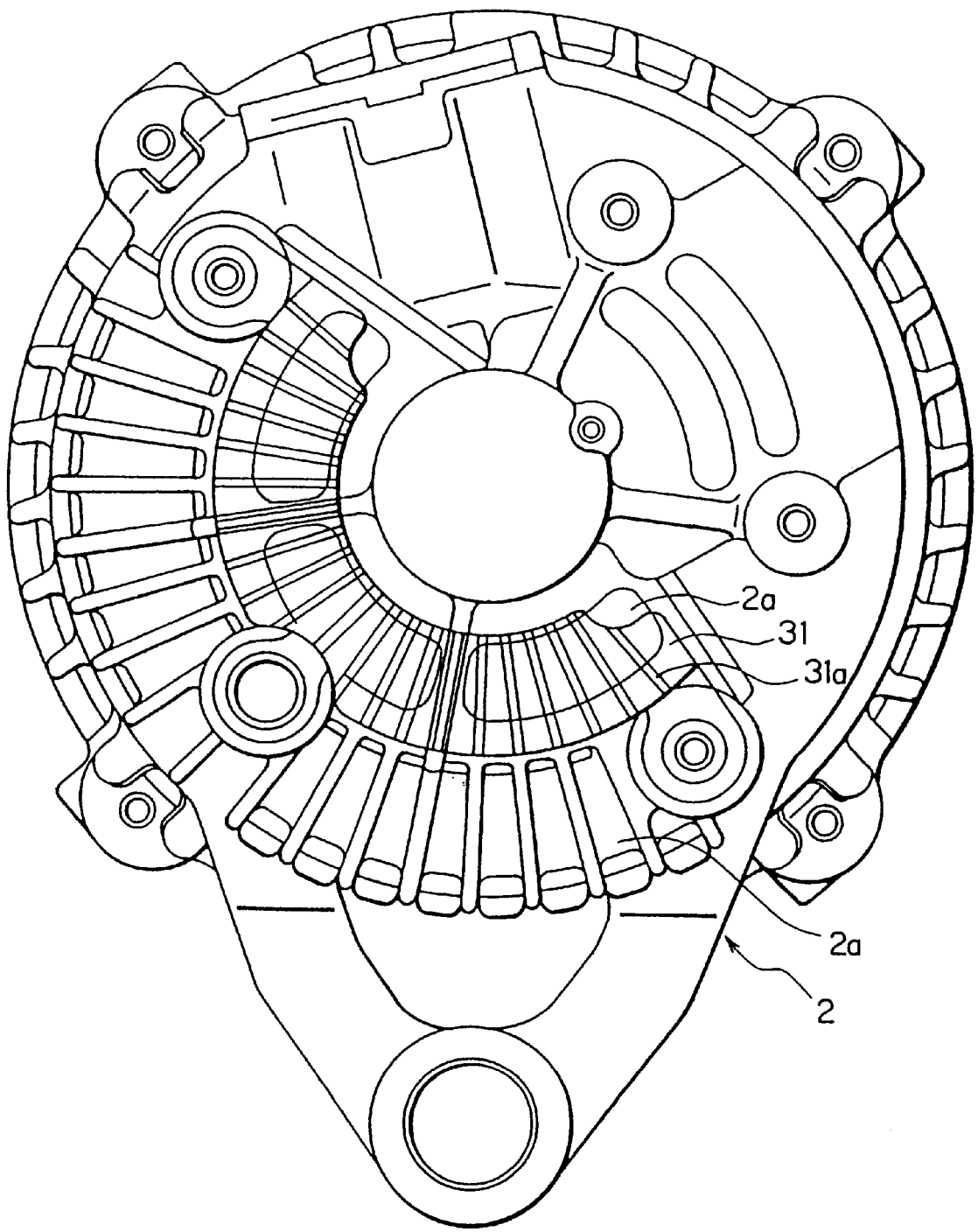
FIG. 16 is a planar projection of the rear bracket of another conventional automotive alternator.
Figure 17:
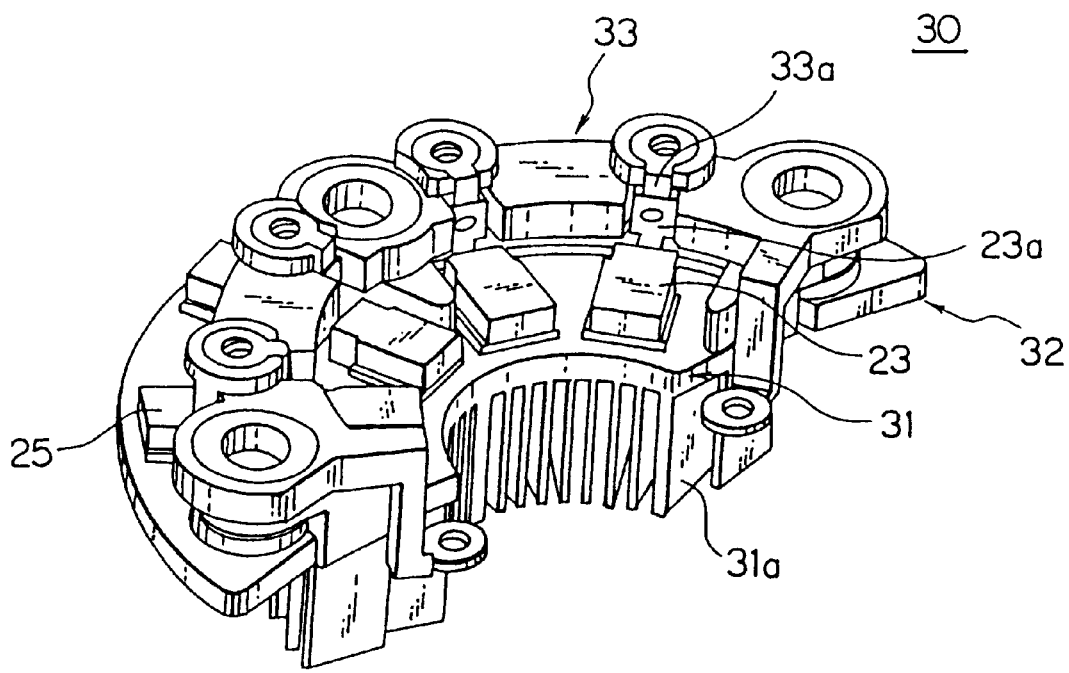
FIG. 17 is a perspective showing a rectifier used in the conventional automotive alternator shown in FIG. 15.
Figure 18:
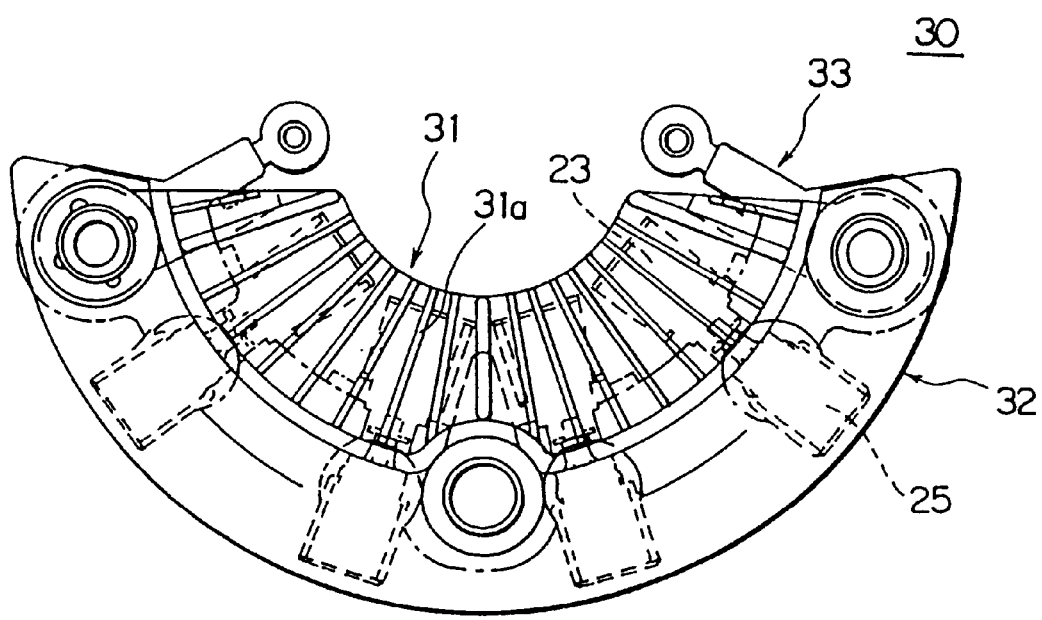
FIG. 18 is a plan showing a rectifier used in the conventional automotive alternator shown in FIG. 15.

Because the base 44 of the heat sink 43 is formed in a planar horseshoe shape, the fin spacing at the outer circumference is wide. After forming heat sinks 43 in this manner, when the heat sinks were placed in boxes in pairs and shipped, as shown in FIG. 11, the outer circumferential edges where the fin spacing is wide mesh with each other (portion B of FIG. 11), giving rise to damage to and cracking of the fins 45. In the heat sink 43 according to Embodiment 4, because a thick portion 46 is disposed on the outer circumferential end of some of the fins 45, pairs of heat sinks no longer overlap from the outer circumferential side, preventing damage to and cracking of the fins 45.

Furthermore, because the spacing between the thick portion 46 and adjacent fins 45 is equal to or greater than the fin spacing at the inner circumferential end, the flow of air is not choked around the thick portion 46 and there is no loss of cooling.

Embodiment 5

In Embodiments 2 to 4 and in the comparative example of Embodiment 2, no mention has been made of the height H, the thickness T, or the array pitch P of the fins, but in Embodiment 5, the heat sinks 43, 35 are defined as heat sinks having tall fins with $H/T \geq 5$, and the fin shape at the inner circumferential end thereof is defined as being shaped to satisfy the expressions $T \leq 1$ mm and $0.35 \leq T/P \leq 0.6$.

Because the fin shape at the inner circumferential end of the heat sinks 43, 35 where the fin spacing is narrow due to the planar horseshoe shape of the base 44 is shaped to satisfy the expressions $T \leq 1$ mm and $0.35 \leq T/P \leq 0.6$, the diode temperature can be kept low without adversely affecting the stator temperature, and highly mass-producible heat sinks can be obtained.

As explained above, by the present invention, there is provided a heat sink being a die cast heat sink provided with:

a flat base having a generally rectangular planar shape, one surface thereof constituting a surface for mounting heat-generating components; and a plurality of fins disposed on the other surface of the base at a pitch (P) in the longitudinal direction of the base, each rising perpendicularly from the other surface of the base and projecting in the longitudinal direction of the base, wherein the projecting height (H) of the fins from the base is five or more times the thickness (T) of the fins, and wherein the plurality of fins are formed such that the thickness (T), height (M), and pitch (P) of the fins satisfy the expressions $T \leq 1$ mm and $0.35 \leq T/P \leq 0.6$, enabling the provision of a highly mass-producible heat sink having superior cooling performance.

Furthermore, a heat sink according to the present invention may be a die cast heat sink provided with:

a flat base having a planar horseshoe shape, one surface thereof constituting a surface for mounting heat-generating components; and a plurality of fins disposed on the other surface of the base in a radial pattern at even angular pitch in the circumferential direction of the base, each rising perpendicularly from the other surface of the base, wherein the projecting height (H) of the fins from the base is five or more times the thickness (T) of the fins, and wherein the plurality of fins are formed such that the thickness (T), height (H), and pitch (P) of the fins at the inner circumferential end satisfy the expressions $T \leq 1$ mm and $0.35 \leq T/P \leq 0.6$, enabling the provision of a highly mass-producible heat sink having superior cooling performance.

Furthermore, the plurality of fins may be formed such that the inner circumferential end of every second fin is positioned radially outside the inner circumferential ends of adjacent fins, enabling the provision of a highly mass-producible heat sink having superior cooling performance.

Furthermore, a thick portion may be disposed at the outer circumferential end of some of the fins, the spacing between the thick portion and adjacent fins being equal to or greater than the fin spacing at the inner circumferential end, eliminating intermeshing of heat sinks and enabling damage to and the generation of cracks in the fins during transport to be prevented.

Furthermore, an automotive alternator according to the present invention may include:

a rotor housed inside a case and supported so as to rotate freely by means of a rotor shaft;

a stator disposed inside the case so as to surround the outer circumference of the rotor; and a rectifier provided with a positive-side and a negative-side heat sinks supporting positive-side and negative-side unidirectional conducting elements, respectively, for rectifying alternating current generated by the rotor, wherein each of the heat sinks is a die cast provided with:

a flat base having a generally rectangular planar shape, one surface thereof constituting a surface for mounting the unidirectional conducting elements; and a plurality of fins disposed on the other surface of the base at a pitch (P) in the longitudinal direction of the base, each rising perpendicularly from the other surface of the base and projecting in the longitudinal direction of the base, wherein the projecting height height (H) of the fins from the base is five or more times the thickness (T) of the fins, and wherein the plurality of fins are formed such that the thickness (T), height (H), and pitch (P) of the fins satisfy the expressions $T \leq 1$ mm and $0.35 \leq T/P \leq 0.6$, enabling the suppression of increases in the stator temperature and the temperature of the unidirectional conducting elements, thereby providing an automotive alternator capable of stable running.

Furthermore, an automotive alternator according to the present invention includes:

a rotor housed inside a case and supported so as to rotate freely by means of a rotor shaft;

a stator disposed inside the case so as to surround the outer circumference of the rotor; and a rectifier provided with a positive-side and a negative-side heat sinks supporting positive-side and negative-side unidirectional conducting elements, respectively, for rectifying alternating current generated by the rotor, wherein the both heat sinks are composed of flat bases having planar horseshoe shapes with different inside diameters from each other, and are disposed such that the planes of each of horseshoe shapes lie generally on a same plane perpendicular to the axis of the shaft and the both bases overlap radially, wherein the positive-side and negative-side unidirectional conducting elements are supported on one surface of their respective bases, and wherein the heat sink disposed radially inside is a die cast provided with:

a plurality of fins disposed on the other surface of the base at a radial pattern at even angular pitch in the circumferential direction of the base, each rising perpendicularly from the other surface of the base, the projecting height (H) of the fins from the base being five or more times the thickness (T) of the fins, and the plurality of fins being formed such that the thickness (T), height (H), and pitch (P) of the fins at the inner circumferential end satisfy the expressions $T \leq 1$ mm and $0.35 \leq T/P \leq 0.6$, enabling the suppression of increases in the stator temperature and the temperature of the unidirectional conducting elements, thereby providing an automotive alternator capable of stable running.

Furthermore, the plurality of fins may be formed such that the inner circumferential end of every second fin is positioned radially outside the inner circumferential ends of adjacent fins, enabling the suppression of increases in the stator temperature and the temperature of the unidirectional conducting elements, thereby providing an automotive alternator capable of stable running.

Furthermore, a intake opening for taking in air may be disposed as horseshoe-shaped aperture along the direction of the array of the plurality of fins in a portion of the case corresponding to the plurality of fins, the inner circumferential edge of the intake opening being positioned radially outwards from the inner circumferential ends of every second fin positioned radially outside the inner circumferential ends of adjacent fins, further enabling the suppression of increases in the temperature of the unidirectional conducting elements.

What is claimed is:

1. An automotive alternator comprising:

a rotor housed inside a case and supported so as to rotate freely by means of a rotor shaft;

a stator disposed inside said case so as to surround the outer circumference of said rotor; and a rectifier provided with a positive-side and a negative-side heat sinks supporting positive-side and negative-side unidirectional conducting elements, respectively, for rectifying alternating current generated by said rotor, wherein said both heat sinks are composed of flat bases having planar horseshoe shapes with different inside diameters from each other, and are disposed such that the planes of each of horseshoe shapes lie generally on a same plane perpendicular to the axis of the shaft and said both bases overlap radially, wherein the positive-side and negative-side unidirectional conducting elements are supported on one surface of their respective bases, and wherein said heat sink disposed radially inside is a die cast provided with:

a plurality of fins disposed on the other surface of said base at a radial pattern at even angular pitch in the circumferential direction of said base, each rising perpendicularly from the other surface of said base, the projecting height (H) of said fins from said base being five or more times the thickness (T) of said fins, and said plurality of fins being formed such that the thickness (T), height (H), and pitch (P) of said fins at the inner circumferential end satisfy expressions $T \leq 1$ mm and $0.35 \leq T/P \leq 0.6$.

2. The automotive alternator according to claim 1 wherein said plurality of fins are formed such that the inner circumferential end of every second fin is positioned radially outside the inner circumferential ends of adjacent fins.

3. The automotive alternator according to claim 2 wherein a intake opening for taking in air is disposed as a horseshoe-shaped aperture along the direction of the array of said plurality of fins in a portion of said case corresponding to said plurality of fins, the inner circumferential edge of said intake opening being positioned radially outwards from the inner circumferential ends of every second fin positioned radially outside the inner circumferential ends of adjacent fins.

4. A heat sink being a die cast heat sink comprising:

a flat base having a planar horseshoe shape, one surface thereof constituting a surface for mounting heat-generating components; and a plurality of fins disposed on the other surface of said base in a radial pattern at even angular pitch in the circumferential direction of said base, each rising perpendicularly from said other surface of said base, wherein the projecting height (H) of said fins from said base is five or more times the thickness (T) of said fins, and wherein said plurality of fins are formed such that the thickness (T), height (H), and pitch (P) of said fins at the inner circumferential end satisfy expressions $T \leq 1$ mm and $0.35 \leq T/P \leq 0.6$.

5. The heat sink according to claim 4 wherein a thick portion is disposed at the outer circumferential end of some of said fins, the spacing between said thick portion and adjacent fins being equal to or greater than the spacing between said fins at the inner circumferential end.

6. The heat sink according to claim 4 wherein said plurality of fins are formed such that the inner circumferential end of every second fin is positioned radially outside the inner circumferential ends of adjacent fins.

7. The heat sink according to claim 6 wherein a thick portion is disposed at the outer circumferential end of some of said fins, the spacing between said thick portion and adjacent fins being equal to or greater than the spacing between said fins at the inner circumferential end.

8. A heat sink being a die cast heat sink comprising:

a flat base having a generally rectangular planar shape, one surface thereof constituting a surface for mounting heat-generating components; and a plurality of fins disposed on the other surface of said base at pitch (P) in the longitudinal direction of said base, each rising perpendicularly from said other surface of said base and projecting in said longitudinal direction of said base, wherein the projecting height (H) of said fins from said base is five or more times the thickness (T) of said fins, and wherein said plurality of fins are formed such that the thickness (T), height (H), and pitch (P) of said fins satisfy expressions $T \leq 1$ mm and $0.35 \leq T/P \leq 0.6$.

* * * * *